US009632591B1

United States Patent
Marshall et al.

(10) Patent No.: US 9,632,591 B1
(45) Date of Patent: Apr. 25, 2017

(54) CAPACITIVE KEYBOARD HAVING VARIABLE MAKE POINTS

(71) Applicant: Apple Inc., Cupertino, CA (US)

(72) Inventors: Blake R. Marshall, Cupertino, CA (US); Liquan Tan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 28 days.

(21) Appl. No.: 14/533,044

(22) Filed: Nov. 4, 2014

Related U.S. Application Data (60) Provisional application No. 62/056,005, filed on Sep. 26, 2014.

(51) Int. Cl.
G06F 3/041 (2006.01)
G06F 3/023 (2006.01)
G06F 3/044 (2006.01)

(52) U.S. Cl.
CPC .............. G06F 3/023 (2013.01); G06F 3/041 (2013.01); G06F 3/044 (2013.01)

(58) Field of Classification Search
CPC ............ H03K 17/9622; H03K 17/962; H03K 17/965; H03K 17/967; H03K 17/975; H03K 2217/960755; G06F 3/044; G06F 3/041
See application file for complete search history.

(56) References Cited

U.S. PATENT DOCUMENTS

| | | | | |
|---|---|---|---|---|
| 4,771,139 A | * | 9/1988 | DeSmet | H01H 13/807 200/304 |
| 4,857,684 A | * | 8/1989 | Gratke | H03K 17/98 200/600 |
| 4,933,807 A | * | 6/1990 | Duncan | G10H 1/0551 361/283.2 |
| 6,204,839 B1 | * | 3/2001 | Mato, Jr. | G06F 1/1616 341/22 |
| 6,918,612 B2 | * | 7/2005 | Smith | B60R 21/01532 180/273 |
| 7,999,643 B1 | * | 8/2011 | Dening | H01H 1/0036 200/181 |
| 8,450,627 B2 | | 5/2013 | Mittleman et al. | |
| 2007/0102266 A1 | * | 5/2007 | Wingett | H01H 25/041 200/5 A |
| 2007/0229464 A1 | * | 10/2007 | Hotelling | G06F 3/0414 345/173 |
| 2008/0088582 A1 | * | 4/2008 | Prest | G06F 3/0338 345/156 |
| 2008/0088597 A1 | * | 4/2008 | Prest | G06F 3/0338 345/173 |

(Continued)

FOREIGN PATENT DOCUMENTS

WO WO 2014/006456 1/2014

*Primary Examiner* — Michael J Eurice
(74) *Attorney, Agent, or Firm* — Brownstein Hyatt Farber Schreck, LLP (57) ABSTRACT

Disclosed herein is an input device having variable make points. More specifically, the various embodiments described herein are directed to an input device having a key, a first button member and a second button member. A dielectric may be positioned between the first button member and the second button member. The key is also associated with a capacitive sensor that is configured to determine a change in capacitance as a distance between the first button member and the second button member changes.

20 Claims, 6 Drawing Sheets

(56) References Cited

U.S. PATENT DOCUMENTS

| | | | | |
|---|---|---|---|---|
| 2008/0088600 A1* | 4/2008 | Prest | G06F 3/03547 | 345/173 |
| 2008/0297487 A1* | 12/2008 | Hotelling | G06F 1/3203 | 345/173 |
| 2009/0008234 A1* | 1/2009 | Tolbert | H01H 13/702 | 200/600 |
| 2010/0156814 A1* | 6/2010 | Weber | G06F 3/016 | 345/173 |
| 2010/0264007 A1* | 10/2010 | Jung | H01H 13/78 | 200/516 |
| 2011/0186413 A1* | 8/2011 | Chen | B29C 65/52 | 200/5 A |
| 2011/0203912 A1* | 8/2011 | Niu | H01H 3/125 | 200/341 |
| 2011/0221680 A1* | 9/2011 | Karhiniemi | G06F 3/0202 | 345/168 |
| 2011/0241442 A1* | 10/2011 | Mittleman | H03K 17/962 | 307/112 |
| 2011/0255260 A1* | 10/2011 | Weber | H04M 1/026 | 361/807 |
| 2011/0285662 A1* | 11/2011 | Maenpaa | G06F 3/0338 | 345/174 |
| 2012/0032916 A1* | 2/2012 | Enoki | G06F 3/044 | 345/174 |
| 2013/0100030 A1* | 4/2013 | Los | G06F 3/023 | 345/169 |
| 2013/0141342 A1* | 6/2013 | Bokma | G06F 3/03547 | 345/173 |
| 2013/0265062 A1 | 10/2013 | Wang et al. | | |
| 2014/0008999 A1* | 1/2014 | Prest | G01L 1/22 | 307/119 |
| 2014/0027254 A1* | 1/2014 | Kudrna | H01H 13/85 | 200/5 A |
| 2014/0090967 A1* | 4/2014 | Inagaki | H01H 13/14 | 200/513 |
| 2014/0252881 A1* | 9/2014 | Dinh | H01H 13/06 | 307/125 |

\* cited by examiner

CAPACITIVE KEYBOARD HAVING VARIABLE MAKE POINTS

CROSS-REFERENCE TO RELATED APPLICATION

This application is a nonprovisional patent application of and claims the benefit to U.S. Provisional Patent Application No. 62/056,005, filed Sep. 26, 2014 and titled "Capacitive Keyboard Having Variable Make Points," the disclosure of which is hereby incorporated herein by reference in its entirety.

TECHNICAL FIELD

This disclosure relates generally to input devices, and more specifically to keyboards having variable make points.

BACKGROUND

Many electronic devices utilize an input device, such as a keyboard, to receive input from users. In conventional keyboards, an electrical contact is used to record a keystroke. Thus, a keystroke occurs when a first portion of the key physically contacts the electrical contact. If the electrical contact is not physically touched, a keystroke is not recorded. Because the key must physically touch the electrical contact, travel of the key cannot be adjusted once the key is installed in the keyboard.

It is with respect to these and other general considerations that embodiments have been made. Also, although relatively specific problems have been discussed, it should be understood that the embodiments should not be limited to solving the specific problems identified in the background.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Disclosed herein is an input device having that uses capacitive sensing, or other sensing techniques, to determine travel of key of the input device. As a result, the input device may have variable make points. More specifically, the various embodiments described herein are directed to an input device having a key, a first button member and a second button member. A dielectric may be positioned between the first button member and the second button member. The key is also associated with a capacitive sensor that is configured to determine a change in capacitance as a distance between the first button member and the second button member changes. In some embodiments, a first change in capacitance may be associated with a first make point of the key and a second change in capacitance may be associated with a second make point of the key.

Also disclosed is a method of detecting actuation of a key of an input device. In some embodiments, the input device may be a keyboard of a computing device. According to this method, actuation of the key of the input device is received. In some embodiments, the actuation may be made by a finger of a user of the computing device. In other embodiments, the actuation may be made by a stylus or other such input mechanism. In response to the actuation, a change in the capacitance between a first portion of the key and a second portion of the key is determined. When the change in capacitance exceeds a first threshold amount, a first type of output is provided. Further, when the change in capacitance exceeds a second threshold amount, a second type of output is provided. In some embodiments, the second type of output is different than the first type of output.

Additional embodiments disclose an input device comprising a plurality of keys. Each of the plurality of keys has a first actuation member and a second actuation member. The input device also includes a plurality of capacitive sensors. Each capacitive sensor is configured to determine a change in capacitance between the first actuation member and the second actuation member in each of the plurality of keys.

BRIEF DESCRIPTION OF THE DRAWINGS

Reference will now be made to representative embodiments illustrated in the accompanying figures. It should be understood that the following descriptions are not intended to limit the disclosure to one preferred embodiment. To the contrary, each is intended to cover alternatives, modifications, and equivalents as may be included within the spirit and scope of the described embodiments as defined by the appended claims.

The use of the same or similar reference numerals in different drawings indicates similar, related, or identical items where appropriate.

DETAILED DESCRIPTION

The description that follows includes sample systems, methods, and apparatuses that embody various elements of the present disclosure. However, it should be understood that the described disclosure may be practiced in a variety of forms in addition to those described herein.

Embodiments described herein are directed to a capacitive input device. More specifically, the various embodiments described herein are directed to a capacitive keyboard having a plurality of keys with each key having a variable make point. Thus, unlike traditional keyboards that use an electrical contact to record a keystroke, embodiments of the present disclosure detect a change in capacitance, or other measurable characteristic, to determine movement of a key and further to determine a type of output that is to be provided based on the actuation of the key.

For example, conventional keyboards require an upper button portion to contact a lower button portion. The distance the upper button portion travels to make the electric connection with the lower button portion is known as a make distance; the point at which an input is generated by a key press can be defined as the "make point." However, because the upper button portion has to physically touch the lower button portion to make the electrical connection, the make point cannot be adjusted after the key has been fabricated and installed in the keyboard.

In contrast to the conventional keyboard, embodiments described herein use a capacitive sensing technique that enables a key or button of an input device to have variable "make points" (although a physical connection is not required). Thus, because a physical connection is not required between a first button portion and a second button portion, the make point for each key in the keyboard can be adjusted after fabrication.

For example, the input device described herein uses a detected difference in capacitance between a first portion of the key and a second portion of a key to detect movement or actuation of the key. More specifically, a key of the capacitive keyboard described herein includes an upper dome and a lower dome. The upper and lower dome may be separated by a dielectric material. An initial capacitance is present between the upper dome and the lower dome. Further, the capacitance of each key is based on the distance separating the upper dome and the lower dome as well as a permittivity of the dielectric. As the key is actuated (or as the upper dome travels toward the lower dome), the capacitance is increased. When the displacement of the upper dome passes a threshold, or more specifically, when a detected change in capacitance reaches or exceeds a predetermined threshold, a keystroke is recorded.

In addition to the above, the capacitance sensing capabilities of the keyboard may also allow for proximity sensing near the keys. For example, when a user's finger or other input device hovers near or on top of a key, fringing fields may also pass above the key. As such, the presence of a user's finger may be detected and output may be provided accordingly. Thus, the capacitive keyboard disclosed herein is capable of measuring the displacement of a single key as well as performing proximity sensing of various objects that are around the keys.

Figure 1:
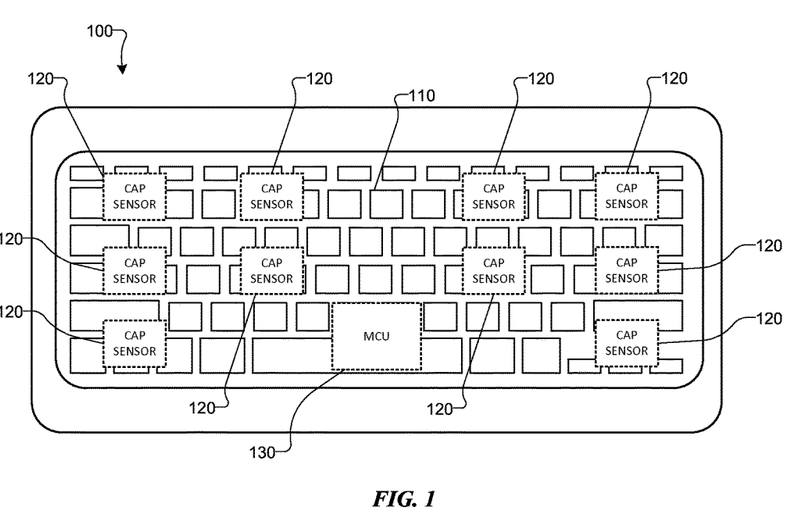
FIG. 1 illustrates a capacitive input device according to one or more embodiments of the present disclosure.

FIG. 1 illustrates a capacitive input device 100 according to one or more embodiments of the present disclosure. In certain embodiments, the capacitive input device 100 may be a keyboard. The keyboard may be used with a laptop computer, tablet computer, desktop computer or other such computing device. Further, although a keyboard is specifically shown and discussed, embodiments disclosed herein may be used with a variety of input devices. For example, the embodiments disclosed herein may be used with a button or other actuation member on a portable computing device. These portable computing devices may include a mobile phone, a tablet computer, a media player, a wearable electronic device and so on. Likewise, other input mechanisms and devices may implement functionality, structures and/or methods described herein. For example, a mouse, switch, button, biometric sensor, joystick, and so on may operate or incorporate structures in accordance with the discussion herein.

In some embodiments, the capacitive input device 100 may include a plurality of keys 110. Although not shown in FIG. 1, each key 110 may be comprised of a key assembly having a keycap, an upper dome and a lower dome arranged in a parallel plate model. Each key 110 may also include a dielectric material or other substance disposed between the upper dome and the lower dome. In some embodiments, the dielectric is used, along with a capacitive sensor 120, to determine a change in capacitance between the upper dome of the key 110 and a lower dome of the key 110 as the key 110 is actuated.

Although a capacitive sensor is specifically shown in FIG. 1 and mentioned above, in some embodiments, each key 110 or key assembly may be associated with a capacitance sensing chip, or one or more capacitive sensors may be embodied as a capacitive sensing chip (for example, as a system-on-chip or other integrated circuit). Thus, as each key 110 is actuated, the capacitance sensing chip may be configured to sense the change in capacitance of the key 110. In some embodiments, each key 110 may be associated with a single capacitance sensing chip. In other embodiments, multiple keys may be associated with a capacitance sensing chip. In still yet other embodiments, the one or more keys may be associated with an array of capacitance sensing chips. Accordingly, discussions of capacitive sensors herein are intended to cover capacitive sensing chips and other capacitive sensing structures.

Because capacitance may be used to alter or otherwise dynamically change the make points of the various keys 110, noise and/or interference may corrupt the capacitive measurement. For example, parasitic capacitances created by long traces and size constraints on the keyboard may cause the capacitive signal to degrade. As such, the capacitive input device 100 described herein and shown in FIG. 1 includes a number of different capacitive sensors 120 disposed in different areas. Because the capacitive sensors 120 are positioned at different areas within the capacitive input device 100, parasitic capacitance may be reduced. For example, traces between the capacitive sensors 120 and the microcontroller 130 are relatively small. In addition, interference between the capacitive sensors 120 is also reduced which further reduces parasitic capacitance.

Figure 2A:
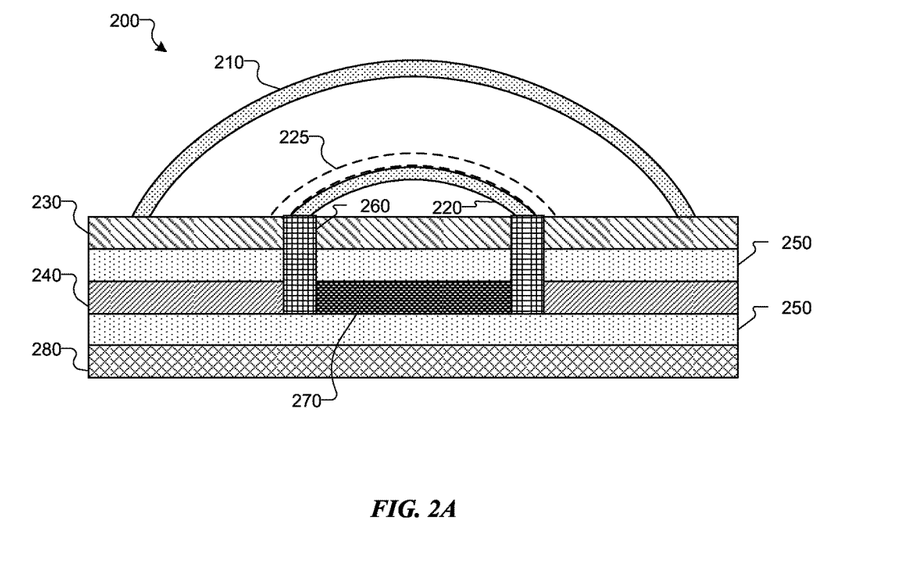
FIG. 2A illustrates a stack assembly of a key of a capacitive input device according to one or more embodiments of the present disclosure.

Because the capacitive input device 100 includes a number of different capacitive sensors 120, each capacitive sensor 120 may be associated with a specific key. More specifically, as shown in FIG. 2A, each key (or button) of the capacitive input device 100 may be associated with a single capacitive sensor 120. In another embodiment, a single capacitive sensor 120 may be configured to receive capacitance readings from a group of keys 110. For example, a first capacitive sensor may be associated with a first group of keys while a second capacitive sensor may be associated with a second group of keys. In still yet other embodiments, an array of capacitive sensors may receive readings from a single key 110 or a group of keys 110.

Although not shown for clarity, each capacitive sensor 120 may be coupled to a microcontroller 130 using various traces. As the microcontroller 130 is electrically coupled to each capacitive sensor 120, the microcontroller 130 may be used to determine whether various make points of each key 110 have been reached, whether one or more keys should be active or inactive, as well as a sensitivity threshold of each key 110. More specifically, the microcontroller 130 may be used to determine whether a change in capacitance of an actuated key is equivalent to a first make point that is associated with a first type of input or a second make point that is associated with a second type of input. In other embodiments, the microcontroller 130 may be configured to adjust the sensitivity of each key 110 or group of keys 110.

In yet other embodiments, the microcontroller 130 may determine whether a change in capacitance of a key 110 is equivalent to actuation of the key 110 or whether the change in capacitance is due to a user resting or placing a finger on or near a key 110.

FIG. 2A illustrates a stack assembly of a key 200 of a capacitive input device 100 according to one or more embodiments of the present disclosure. For example, the key 200 may be used as a key 110 of the capacitive input device 100 shown and described above with respect to FIG. 1. In other embodiments, the key 200 may be used as a button or other input mechanism for a portable computing device or other electronic device.

As shown in FIG. 2A, the key 200 includes a first button member or a first dome 210 and a second button member or a second dome 220. A dielectric 225 may be disposed between the first dome 210 and the second dome 220. As also shown in FIG. 2A, the key 200 may include or otherwise be associated with various layers. For example, the first dome 210 may be coupled to a ground layer 230. A second layer 240 may include various routing and ground components as well as capacitive sensing circuitry 270. In some embodiments, the second dome 220 is connected to the capacitive sensing circuitry 270 through vias 260. The bottom layer 280 may include various other chips and/or some digital routing components or modules. As also shown, each layer may be separated by a substrate 250.

Figure 2B:
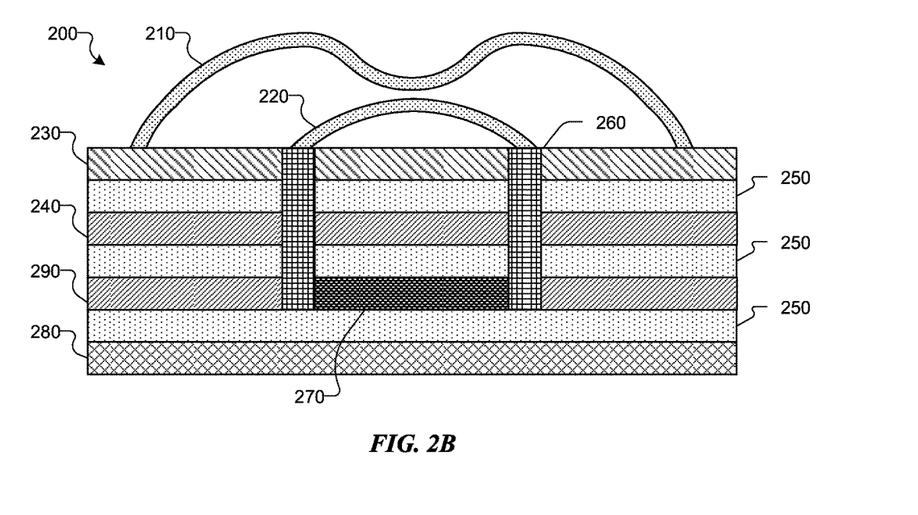
FIG. 2B illustrates actuation of the key of FIG. 2A according to one or more embodiments of the present disclosure.
Figure 2C:
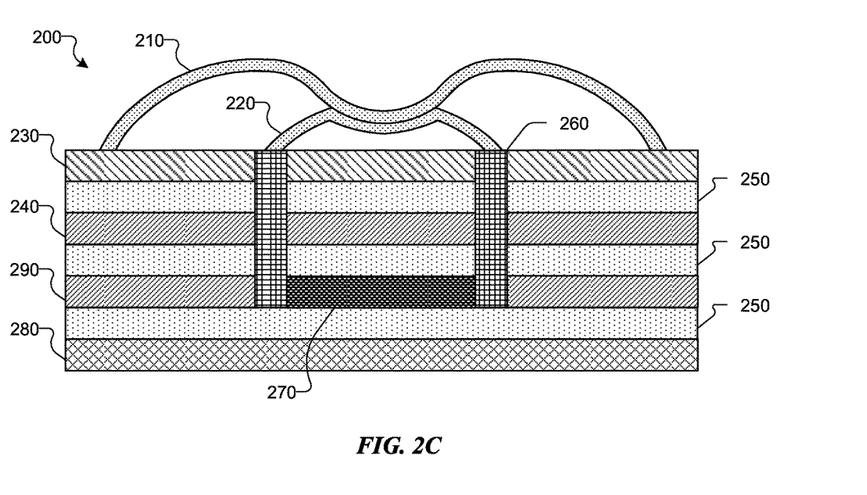
FIG. 2C illustrates a second exemplary actuation of the key of FIG. 2A according to one or more embodiments of the present disclosure.
Figure 2D:
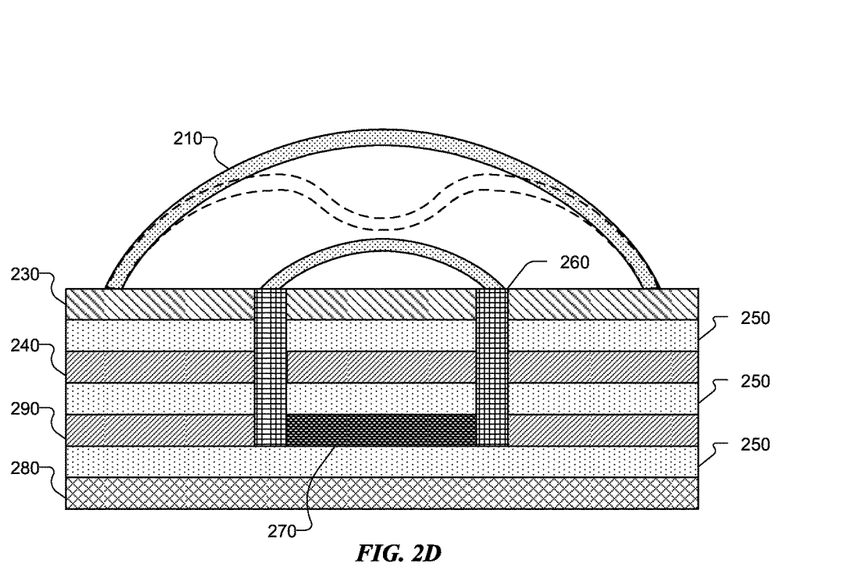
FIG. 2D illustrates exemplary deflection positions of a button portion of a key of a capacitive input device according to one or more embodiments of the present disclosure.

In the illustrated embodiment, the capacitive sensing circuitry 270 is disposed on the second layer 240. However, it is contemplated that the capacitive sensing circuitry 270 may be disposed on various other layers. For example, as shown in FIG. 2B-FIG. 2D, the capacitive sensing circuitry 270 may be formed on the third layer 290. In such a configuration, the capacitive sensing circuitry 270 and/or the traces of the capacitive sensing circuitry are farther away from ground layer 230. As a result of this configuration, parasitic capacitance may be minimized. In addition, the layout of the key 200 shown in FIG. 2B-FIG. 2D helps eliminate noise and false readings. As a result, the capacitance of each key 200 can be measured more accurately and each key 200 may have variable make points with each make point providing a different type of output.

Referring back to FIG. 2A, in some embodiments, the second dome 220 may be disposed within or underneath the first dome 210. In addition, a dielectric 225 is disposed between the first dome 210 and the second dome 220. Although the dielectric 225 is shown being coupled to the second dome 220, this coupling is not required. For example, the dielectric 225 may be disposed at various places between the first dome 210 and the second dome 220.

As the key 200 is actuated, the first dome 210 and the second dome 220 may be deflected. Deflection of the first dome 210 is shown in FIG. 2B a deflection of the first dome 210 and the second dome 220 is shown in FIG. 2C (although present, the dielectric 225 is omitted from FIG. 2B-FIG. 2D for clarity). In some embodiments, the deflection of the first dome 210 and/or the second dome 220 may be caused by a finger of a user. In other embodiments, the deflection may be caused by another actuation member such as, for example, a stylus or other such device.

Deflection of the first dome 210 causes a change in capacitance of the dielectric 225. The change in capacitance is then sensed by a capacitive sensing circuitry 270. In some embodiments, the capacitive sensing circuitry 270 may be formed from a capacitive sensing element array. Further, each capacitive sensing element of the array may register a voltage that varies with the capacitance of a capacitive coupling. The capacitance signal may be detected by sensing the change in voltage on the capacitive sensing element as the relative voltage between the first dome 210 and the second dome 220 changes. Alternately, the capacitance signal may be detected by sensing the change in charge received by the capacitive sensing circuitry as the relative voltage between the first dome 210 and the second dome 220 changes. Thus, based on the sensed capacitance change, a determination may be made as to how far the first dome 210 and/or the second dome 220 has been deflected. Once the deflection distance has been determined, various keystrokes and/or output may be recorded and/or provided.

In some embodiments, multiple states of deflection (or distances of travel of the first dome 210 and the second dome 220) may be associated with different keystrokes or make points of the key 200. More specifically, deflection of the first dome 210 in the manner shown in FIG. 2B causes a first change in capacitance. For example, as a distance between the first dome 210 and the second dome 220 decreases (e.g., due to the first dome 210 being deflected) the capacitive sensing circuitry 270 of the key 200 detects the change in capacitance between the first dome 210 and the second dome 220. As a result, a first type of output may be provided.

Likewise, deflection of the first dome 210 and the second dome 220 shown in FIG. 2C causes a second change in capacitance that is greater than the first change in capacitance. For example, the first dome 210 may be actuated in such a manner that the second dome 220 is also deflected. In such embodiments, a second type of output may be provided.

Although FIG. 2B and FIG. 2C illustrate deflection of the first dome 210 and the second 220 for specific distances, the embodiments disclosed herein are not so limited. For example, as shown in FIG. 2D, the first dome 210 may be deflected any desirable distance. Due to the deflection, a change in capacitance may be determined. This change in capacitance may then be used to determine output that is provided by actuation of a particular key. In some instance, and as will be discussed below, the presence of a user's finger or fingers above each key 200 may cause a change in capacitance. As a result, various inputs and/or outputs may be detected based on the position of a user's finger or hand with respect to the key 200.

In some embodiments, the change in capacitance may also be coupled with another measurable characteristic. Depending on the combination, the output that is provided may change. For example, change in capacitance may be combined with a time variable, a force variable, a velocity variable and so on. Thus, change in capacitance over a first time period may provide a first type of output while change in capacitance over a second time period may provide a second type of output. In this fashion, keys may provide an input to an associated system only after the make point is reached and the key is held at the make point for a certain time. This may be useful to confirm particular actions, such as requiring a user to press and hold an input element for a specific time in order to delete a file, change operating parameters, and the like.

Although sensing a change in capacitance is specifically disclosed, embodiments of the present disclosure are not so limited. For example, in other embodiments, the first dome 210 may have a metal or metal traces and an inductive coil may be used to determine a change of inductance between the first dome 210 and the second dome 220. In another embodiment, a light source and light sensor may be used to determine movement of the first dome 210 (or upper dome) with respect to the second dome 220 (or lower dome). For example, light from the light source may shine on a bottom surface of the first dome 210. As the first dome 210 moves or is actuated, the light reflected from the light source and received by the light sensor may increase. Although specific examples have been given, various deflection states of the first dome 210 and/or the second dome 220 may be measured and determined using other measurable characteristics.

Figure 3:
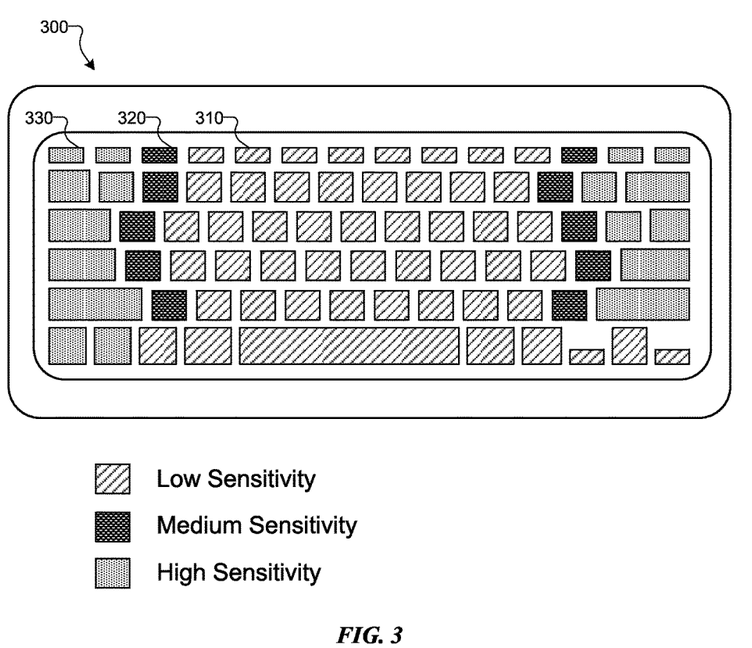
FIG. 3 illustrates an exemplary keyboard having different capacitive thresholds according to one or more embodiments of the present disclosure.

Using the embodiments described herein, a make point of each key or button of an input device can be set individually. More specifically, a required change in capacitance or a threshold change in capacitance for certain types of keystrokes may be set for each key or button press. As a result, the capacitive input device may be highly customizable. For example, FIG. 3 illustrates capacitive keyboard 300 having different thresholds of capacitance according to one or more embodiments of the present disclosure. In some embodiments, the capacitive keyboard 300 may be equivalent to the capacitive input device 100 shown and described above. Further, the capacitive keyboard 300 may include various keys such as key 200 described above with respect to FIG. 2.

In some embodiments, keystroke settings (or threshold capacitance settings) of the capacitive keyboard 300 can be created based on operations that are being performed by a user. In another embodiment, the settings of the keyboard may be based on one or more conditions of the user. For example, sensitivity settings of the capacitive keyboard 300 may be based on which fingers depress certain keys. More specifically, keys depressed by weaker fingers may have lower capacitance thresholds than keys depressed by stronger fingers.

Referring to the example shown in FIG. 3, outer keys 330 of a capacitive keyboard 300 are typically actuated by weaker fingers, such as the pinky. As a result, the capacitive sensitivity of the outer keys 330 may be higher (e.g., a detected threshold change in capacitance to register a keystroke is low). As also shown, keys 320 displaced by a ring finger may have a second capacitive sensitivity (e.g., the threshold capacitance change may be higher than the outer keys 330 but lower than the middle keys 310). Continuing with the example, the middle keys 310 that are actuated by the pointer and middle fingers may have a low sensitivity (e.g., a higher threshold change in capacitance may be required for a keystroke to be registered).

Although a specific layout is shown in FIG. 3, the capacitive keyboard 300 may have various layouts and settings. For example, the capacitive keyboard 300 may have capacitance threshold settings such that keys that are more commonly used have a lower threshold than other keys on the capacitive keyboard 300. Furthering the example, the number keys, punctuation keys, and function keys may have high threshold (or the lowest sensitivity) since these keys are not commonly typed as quickly as the letter keys. Likewise, a shift key, an enter key and other control keys may have a medium sensitivity while the letter keys have high sensitivity.

Because the make points of each key may be determined electrically, a make point of each key may be adjusted dynamically without rebuilding the key for a different make point. As a result, a keyboard implementing the embodiments disclosed herein may have dynamic make points that change, based on, for example, the operations being performed by a computing device associated with the capacitive keyboard 300. For example, if a computer game is being executed on the computing device, only the keys required for the computer game may be active while the rest of the keys can be deactivated. Further, various keys may alternate between being active and inactive during the course of the gaming application and depending on input that is to be provided to the computer game or other application. In another embodiment, the make point of each key in the capacitive keyboard 300 may be adjusted based on typing preferences or habits of a user. As one non-limiting example, the sensitivity of each key in the keyboard could be dynamically adjusted based on how hard or soft a user presses the keys of the capacitive keyboard 300. Further, the capacitive keyboard 300 (or associated system, or other input device configured as generally described herein) may learn a user's input habits and thus dynamically and/or intelligently adjust particular keys accordingly. Continuing the example, if a user routinely presses more softly with his or her pinky fingers than with his or her index fingers, the keys that are typically pressed by a pinky finger over time may have a shorter make distance and correspondingly adjusted make point.

As another non-limiting example, the keys' sensitivities may be adjusted based on a perceived location of a user's fingers (for example by capacitively sensing a hovering finger, touch event or near-touch event) in order to limit inadvertent presses of certain keys by a user's palm or the like. As still another non-limiting example, the make points of keys may be dynamically adjusted depending on the function of the keys; for example, a key that initiates deletion of a file, emptying of a trash bin or the like may require a firmer or longer press than a key that opens a new window in an operating system. Thus, the capacitive keyboard 300 can be configured for many different applications on a computing device and is able to adapt based on a number of different settings and/or on operations that are being performed by or executed on a computer.

In some embodiments, the variable make capacitive keyboard 300 of the present disclosure may be used to determine one or more gestures provided by a user. These gestures may be made by moving a finger or fingers (or other input mechanism) in various patterns over one or more keys of the keyboard. Based on the received gestures, different types of output may be provided.

Figure 4:
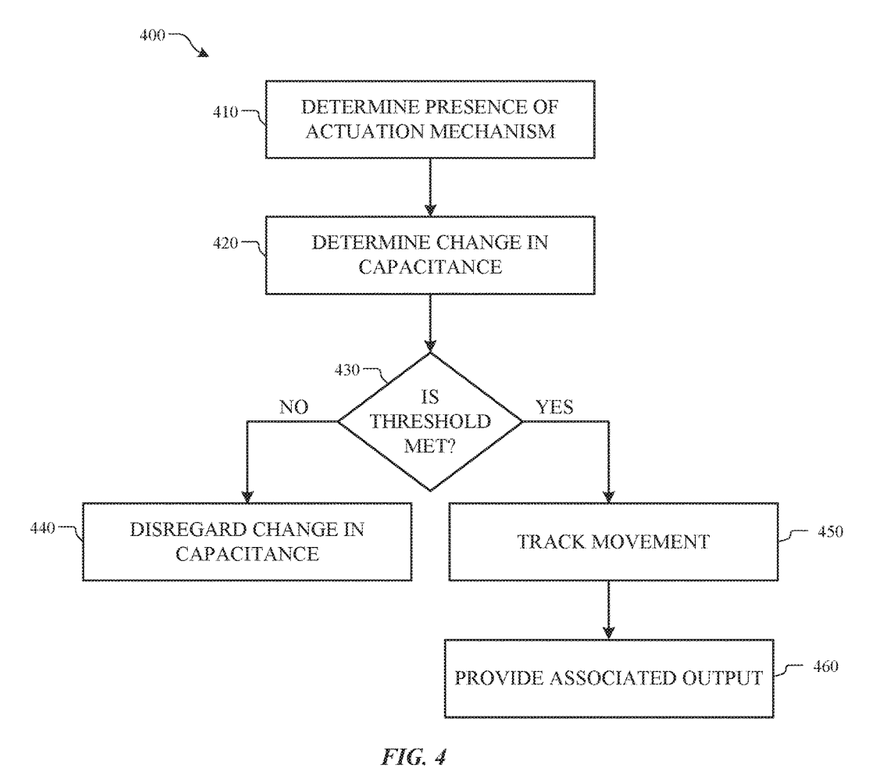
FIG. 4 illustrates a method for receiving gesture input using one or more keys of an input device according to one or more embodiments of the present disclosure.

As such, FIG. 4 illustrates a method 400 for receiving gesture input using one or more keys of an input device according to one or more embodiments of the present disclosure. In some embodiments the method 400 may be used with the various embodiments described above with respect to FIG. 1-FIG. 3.

Method 400 begins at operation 410 in which a presence of an actuation member is detected. In some embodiments the input device may be a variable make capacitive keyboard such as described above. As such, when a finger of a user, or other such input mechanism, is placed on, hovered over or otherwise placed in proximity to a key of the keyboard, a capacitive sensor may detect the presence of the user's finger due to a change in capacitance.

As described above, the change in capacitance may be detected by one or more capacitive sensors associated with one or more keys in the keyboard. Alternatively, change in light or a change in inductance may also be used to detect the presence of an actuation member such as described above.

Once the actuation member is detected, flow proceeds to operation 420 in which an amount of change of capacitance is determined. More specifically, a determination is made as to whether the change in capacitance caused by the presence of the actuation member is above a predetermined threshold. In some embodiments, the change in capacitance may be due to the presence of the user's finger and/or a deflection of a dome portion of one or more keys on the keyboard.

The threshold capacitance may be dynamically changed based on an application or other operations being executed by a computing device associated with the keyboard. In another embodiment, the threshold capacitance may be based on one or more user settings. In addition, each key of the keyboard may have a different threshold setting. Thus, a first key or set of keys may have a first threshold setting while a second key or set of keys has a second threshold setting.

Once the change in capacitance is determined, flow proceeds to operation 430 and a determination is made as to whether the measured change in capacitance meets a threshold. If the threshold is not met, operation 440 provides that the change in capacitance is disregarded and no output is provided. However, if the change in capacitance exceeds the threshold, flow proceeds to operation 450 and the movement of the actuation mechanism and/or the movement of one or more keys is tracked.

As the movement of the actuation mechanism is tracked, flow proceeds top operation 460 and output associated with the tracked movement is provided. In some embodiments, the tracked movement may be a gesture or a series of gestures.

For example, the variable make input device described herein may be capable of tracking various gestures such as, for example, directions of left, right, up, down, diagonal and so on. Thus, if the user swipes across the keyboard to the left, a first action is performed. For example, if a document is displayed on the computing device, the document may move forward one page in response to the gesture. Likewise, if a user swipes a finger across the keyboard to the right, a second action is performed. Continuing with the example above, the swipe to the right may cause the document to move back one page. Thus, the various gestures received by the keyboard may be similar to flipping the pages of a book.

In another example, a gesture may be used to delete a word or words in a word processing application. For example, instead of pressing a delete key to delete a word or a letter, a user could swipe a finger back and forth on one or more keys. This swiping action may mimic movement of an eraser. As a result of the received gesture, a letter, word, sentence etc. that is output on a display of a computing device may be removed. Although specific gestures are mentioned, it is contemplated that gestures may be used in other scenarios.

In yet other embodiments, the change in capacitance may be used to preview various shortcuts or alternate letters, symbols and so on associated with a key. For example, if one finger was hovering above or actuating a "control" key and another finger is above or on the "C" key, a preview window may be output on a display that indicates that the selected combination of keys would perform a "Copy" function. Furthering the example, if the finger is moved from the "C" key to the "V" key, the preview window would indicate that a "Paste" function would be performed. Other preview functionalities may be implemented for different applications, processes, operating systems, and so on. Further, it should be appreciated that the above permits a single key to have multiple input functionalities; a "hover" or near-touch may be sensed and generate a first input (for example, to open the preview as described) while a touch may be sensed and used to generate a second input (such as any input corresponding to the make point being reached). In addition, in some embodiments the preview or hover functionality may occur only after the finger is present above or on the surface of a key for a minimum time in order to prevent false inputs. It may also be appreciated that a touch of a key or other input element may be differentiated from a hover or a press, and thus provide additional functionality or potentially the same functionality as either a hover or a press.

Figure 5:
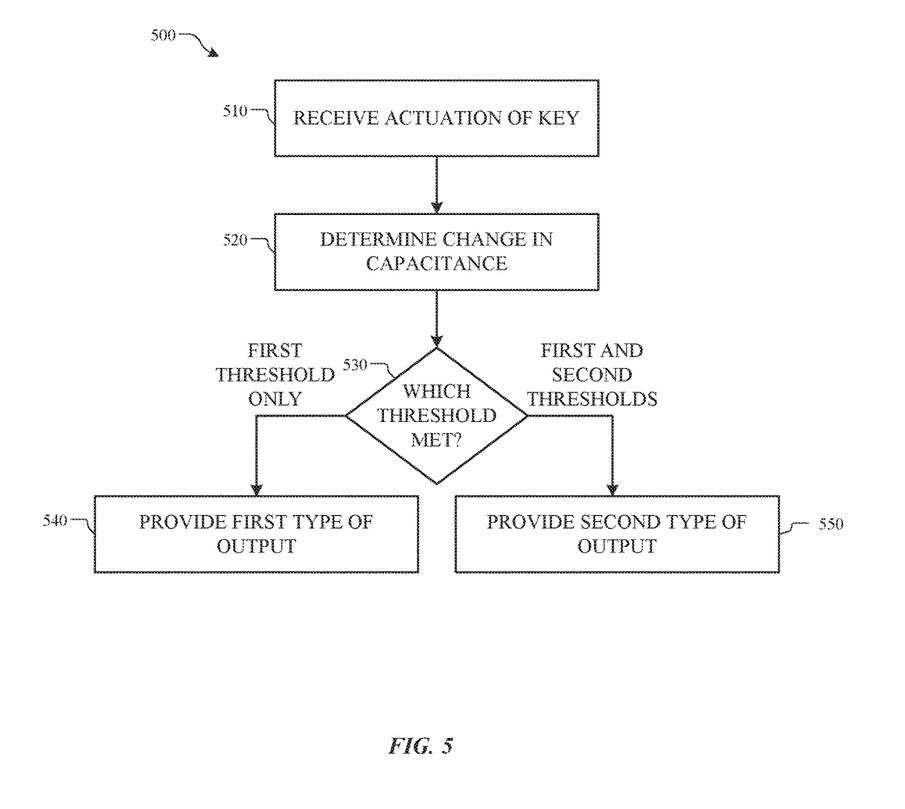
FIG. 5 illustrates a method for detecting actuation of a key of an input device according to one or more embodiments of the present disclosure.

As also discussed above, the capacitive keyboard of the present disclosure may be used to detect various different types of input. More specifically, a make point of each key in the keyboard may be dynamically adjusted and/or provide different types of output. As such, FIG. 5 illustrates a method 500 for detecting actuation of a key of an input device according to one or more embodiments of the present disclosure. As with method 400 of FIG. 4, method 500 be used with the various embodiments described above with respect to FIG. 1-FIG. 3.

Method 500 begins at operation 510 when a key of a keyboard or other input device is actuated. The actuation of the key of the keyboard may be made by a finger of a user or other actuation mechanism. In some embodiments, the key may not be physically actuated as a user is resting or hovering a finger over one or more keys of the keyboard. Although the key may not be physically actuated, operation 510 may detect the presence of the finger or other actuation mechanism.

When the key is actuated, flow proceeds to operation 520 and a change in capacitance of the key is determined. As discussed above, each key in the keyboard may be associated with a capacitive sensor. Thus, as the key is actuated, various travel distances of the key cause a change in capacitance. Further, various levels of capacitive change may be associated with different commands. For example, a first change in capacitance may be associated with a first command and a second change in capacitance may be associated with a second command.

Flow then proceeds to operation 530 and a determination is made as to whether a change in capacitance meets a first threshold level or a second threshold level. For example, if the change in capacitance meets a first threshold but not a second threshold, flow proceeds to operation 540 and a first type of output is provided. However, if the change in capacitance meets a second threshold, flow proceeds to operation 550 and a second type of output is provided.

In a more specific example, using the method 500 described above, a light key tap may be distinguishable from a heavy key press. For example, when a delete key is actuated, a tap on the delete key may delete a single character. Alternatively, a heavy key press may indicate that the entire word is to be deleted. In another example, a tap could be used for a capital letter while a heavy press is used to output a lowercase letter. In yet another example, numbers or symbols may be output depending on the key press. For example, if the "1" button is solidly pressed, a "1" is may be output on a display. However, if the "1" button is lightly tapped a "!" may be output on the display. In the present disclosure, the methods disclosed may be implemented utilizing sets of instructions or software readable by a device. Further, it is understood that the specific order or hierarchy of steps in the methods disclosed are examples of sample approaches. In other embodiments, the specific order or hierarchy of operations in the method can be rearranged with some of the operations being removed or combined. The accompanying method claims present elements of the various steps in a sample order, and are not necessarily meant to be limited to the specific order or hierarchy presented.

Manufacture of the input devices and/or operation of such input devices described in the present disclosure may utilize a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

We claim:

1. An input device, comprising:
   a key;
   a first button member associated with the key;
   a second button member associated with the key and disposed within the first button member;
   a dielectric material positioned between the first button member and the second button member; and
   a capacitive sensor configured to determine a change in a capacitance as a distance between the first button member and the second button member changes, wherein:
   the first button member and the second button member are disposed, at least in part, above a ground layer, and
   a first change in the capacitance is associated with a first make point of the key and a second change in the capacitance is associated with a second make point of the key.

2. The input device of claim 1, wherein the first button member is a dome.

3. The input device of claim 1, wherein the second button member is a dome.

4. The input device of claim 1, wherein the capacitive sensor is configured to detect a change in a second capacitance of a second key of the input device.

5. The input device of claim 4, wherein a first type of actuation is associated with the first make point.

6. The input device of claim 5, wherein a second type of actuation is associated with the second make point.

7. The input device of claim 6, wherein output associated with the first type of actuation is different than output associated with the second type of actuation.

8. The input device of claim 6, wherein output associated with the first type of actuation of the key is associated with output associated with the second type of actuation of the key.

9. A method of detecting actuation of a key of an input device, the method comprising:
   receiving actuation of the key of the input device;
   detecting a change in capacitance between a first portion of the key and a second portion of the key, the first portion and the second portion being disposed, at least in part, above a ground layer;
   when the change in capacitance exceeds a first threshold amount, causing a first type of output; and
   when the change in capacitance exceeds a second threshold amount, causing a second type of output that is different than the first type of output.

10. The method of claim 9, wherein the change in capacitance between a first portion of the key and a second portion of the key is based, at least in part, on a change of distance between the first portion of the key and the second portion of the key.

11. The method of claim 9, wherein the first type of output is associated with the second type of output.

12. The method of claim 9, further comprising receiving actuation of a second key and detecting a change in capacitance between a first portion of the second key and a second portion of the second key.

13. The method of claim 12, further comprising:
   detecting a change in capacitance between the first portion of the second key and the second portion of the second key; and
   when the change in capacitance exceeds third threshold amount, causing the first type of output, wherein the third threshold amount is different than the first threshold amount and the second threshold amount.

14. The method of claim 13, further comprising:
   detecting the change in capacitance between the first portion of the second key and the second portion of the second key; and
   when the change in capacitance exceeds a fourth threshold amount, causing the second type of output, wherein the fourth threshold amount is different than the first threshold amount, the second threshold amount and the third threshold amount.

15. An input device comprising:
   a plurality of keys, wherein each of the plurality of keys has:
      a first actuation member;
      a second actuation member;
   at least one ground layer; and
   a plurality of capacitive sensors;
   wherein:
      the first actuation member and the second actuation member of each key are positioned at least in part above the ground layer;
      each of the plurality of capacitive sensors is configured to determine a change in capacitance between the first actuation member and the second actuation member in each of the plurality of keys, and is adapted to provide each key of the plurality of keys a dynamic make point.

16. The input device of claim 15, wherein a first key in the plurality of keys has a first capacitive sensitivity level and wherein a second key in the plurality of keys has a second capacitive sensitivity level that is different than the first capacitive sensitivity level.

17. The input device of claim 15, wherein the at least one ground layer is positioned between the second actuation member and the plurality of capacitive sensors.

18. The input device of claim 15, wherein a first key of the plurality of keys is associated with a first capacitive sensor and wherein a second key of the plurality of keys is associated with a second capacitive sensor.

19. The input device of claim 15, wherein the change in capacitance occurs in response to actuation of one or more keys of the plurality of keys.

20. The input device of claim 15, wherein the change in capacitance occurs in response to an input mechanism being placed in proximity to one or more keys of the plurality of keys.

\* \* \* \* \*